United States Patent
Dakshina-Murthy et al.

(10) Patent No.: US 6,897,527 B2
(45) Date of Patent: May 24, 2005

(54) STRAINED CHANNEL FINFET (75) Inventors: Srikanteswara Dakshina-Murthy, Austin, TX (US); Judy Xilin An, San Jose, CA (US); Zoran Krivokapic, Santa Clara, CA (US); Haihong Wang, Fremont, CA (US); Bin Yu, Cupertino, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/833,112

(22) Filed: Apr. 28, 2004

(65) Prior Publication Data
US 2004/0195627 A1 Oct. 7, 2004

Related U.S. Application Data (63) Continuation of application No. 10/349,042, filed on Jan. 23, 2003, now Pat. No. 6,803,631.

(51) Int. Cl.$^7$ ............................................. H01L 27/01
(52) U.S. Cl. ....................................... 257/349; 257/192
(58) Field of Search .......................................... 257/349

(56) References Cited

U.S. PATENT DOCUMENTS

| | | | | |
|---|---|---|---|---|
| 6,300,182 B1 | * | 10/2001 | Yu | 438/219 |
| 6,475,869 B1 | | 11/2002 | Yu | 438/303 |
| 6,611,029 B1 | | 8/2003 | Ahmed et al. | 257/365 |
| 6,635,909 B2 | * | 10/2003 | Clark et al. | 257/192 |
| 2003/0201458 A1 | | 10/2003 | Clark et al. | 257/192 |

FOREIGN PATENT DOCUMENTS

| | | |
|---|---|---|
| EP | 1 202 335 A2 | 5/2002 |
| WO | WO 2004/032246 | 4/2004 |

OTHER PUBLICATIONS

Digh Hisamoto et al., FinFET –A Self–Aligned Double –Gate MOSFET Scalabe to nm, IEEE Transactions, on Electron Devices, vol. 47, No. 12, Dec. 2000, pp. 2320–2325.

Yang–Kyu Choi et al., Sub–nm CMOS FinFet Technologies, 2001 IEEE, IEDM, pp. 421–424, No month given.

Xuejue Hang et al., Sub–50 nm P–Channel FinFet Technologies, 2001 IEEE Transactions on Electron Devices, vol. 48, No. 5, May 2001, pp. 880–886.

Xuejue Huang et al., Sub 50nm FinFet: PMOS, 1999 IEEE, IEDM, pp. 67–70, No month given.

Yang–Kyu Choi et al., Nanoscale CMOS Spacer FinFET for the Terabit Era, IEEEElectron Device Letters, vol. 23, No. 1, Jan. 2002, pp. 25–27.

Hiroshi Onoda et al.: "Si–Gate CMOS Devices on a Si/CaF$_2$/Si Structure," *IEEE Transactions on Electron Devices*, vol. 34, No. 11, Nov. 1987, pp. 2280–2285.

* cited by examiner

*Primary Examiner*—Allan R. Wilson
(74) *Attorney, Agent, or Firm*—Harrity & Snyder, LLP

(57) ABSTRACT

A semiconductor device includes a fin and a layer formed on at least a portion of the fin. The fin includes a first crystalline material. The layer includes a second crystalline material, where the first crystalline material has a larger lattice constant than the second crystalline material to induce tensile strain within the layer.

28 Claims, 8 Drawing Sheets

STRAINED CHANNEL FINFET

RELATED APPLICATION

This application is a continuation of U.S. Ser. No. 10/349,042, filed on Jan. 23, 2003, now U.S. Pat. No. 6,803,631 the disclosure of which is hereby incorporated herein by reference.

TECHNICAL FIELD

The present invention relates generally to transistors and, more particularly, to fin field effect transistors (FinFETs).

BACKGROUND ART

Scaling of device dimensions has been a primary factor driving improvements in integrated circuit performance and reduction in integrated circuit cost. Due to limitations associated with existing gate-oxide thicknesses and source/drain (S/D) junction depths, scaling of existing bulk MOSFET devices below the 0.1 µm process generation may be difficult, if not impossible. New device structures and new materials, thus, are likely to be needed to improve FET performance.

Double-gate MOSFETs represent new devices that are candidates for succeeding existing planar MOSFETs. In double-gate MOSFETs, the use of two gates to control the channel significantly suppresses short-channel effects. A FinFET is a recent double-gate structure that includes a channel formed in a vertical fin. The FinFET is similar to existing planar MOSFET in layout and fabrication. The FinFET also provides a range of channel lengths, CMOS compatibility and large packing density compared to other double-gate structures.

DISCLOSURE OF THE INVENTION

Consistent with the present invention, a FinFET transistor is provided that uses a vertically formed strained channel layer that is self-aligned to the fin channel. The strained channel layer may include a crystalline material that is lattice constant mismatched with the crystalline material of the fin of the FinFET. The lattice constant mismatch induces tensile strain within the strained channel layer that increases carrier mobility. Increasing the carrier mobility, in turn, increases the drive current of the FinFET transistor, thus, improving FinFET performance.

Additional advantages and other features of the invention will be set forth in part in the description which follows and, in part, will become apparent to those having ordinary skill in the art upon examination of the following, or may be learned from the practice of the invention. The advantages and features of the invention may be realized and obtained as particularly pointed out in the appended claims.

According to the present invention, the foregoing and other advantages are achieved in part by a semiconductor device that includes a fin. The fin includes a first crystalline material. The device further includes a first layer formed on at least a portion of the fin, the first layer including a second crystalline material. The first crystalline material has a larger lattice constant than the second crystalline material to induce tensile strain within the first layer.

According to another aspect of the invention, a transistor is provided. The transistor includes a fin that further includes a first crystalline material, that has a first lattice constant, and first and second end portions. The transistor includes source and drain regions formed adjacent the first and second end portions of the fin. The transistor further includes a first layer of second crystalline material formed on at least a portion of the fin. The second crystalline material has a second lattice constant, where the first lattice constant is greater than the second lattice constant. The transistor also includes dielectric layer formed on at least a portion of the first layer and a gate electrode formed on at least a portion of the dielectric layer.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims.

Consistent with the present invention, an increased mobility channel FinFET is provided. A vertically formed strained channel layer, consistent with the present invention, is self-aligned to the fin channel of the FinFET. The strained channel layer may include a crystalline material that is lattice mismatched with the crystalline material of the fin of the FinFET such that tensile strain is induced within the strained channel layer. The induced tensile strain increases carrier mobility of the strained channel layer, thus, increasing drive current of the FinFET.

Figure 1:
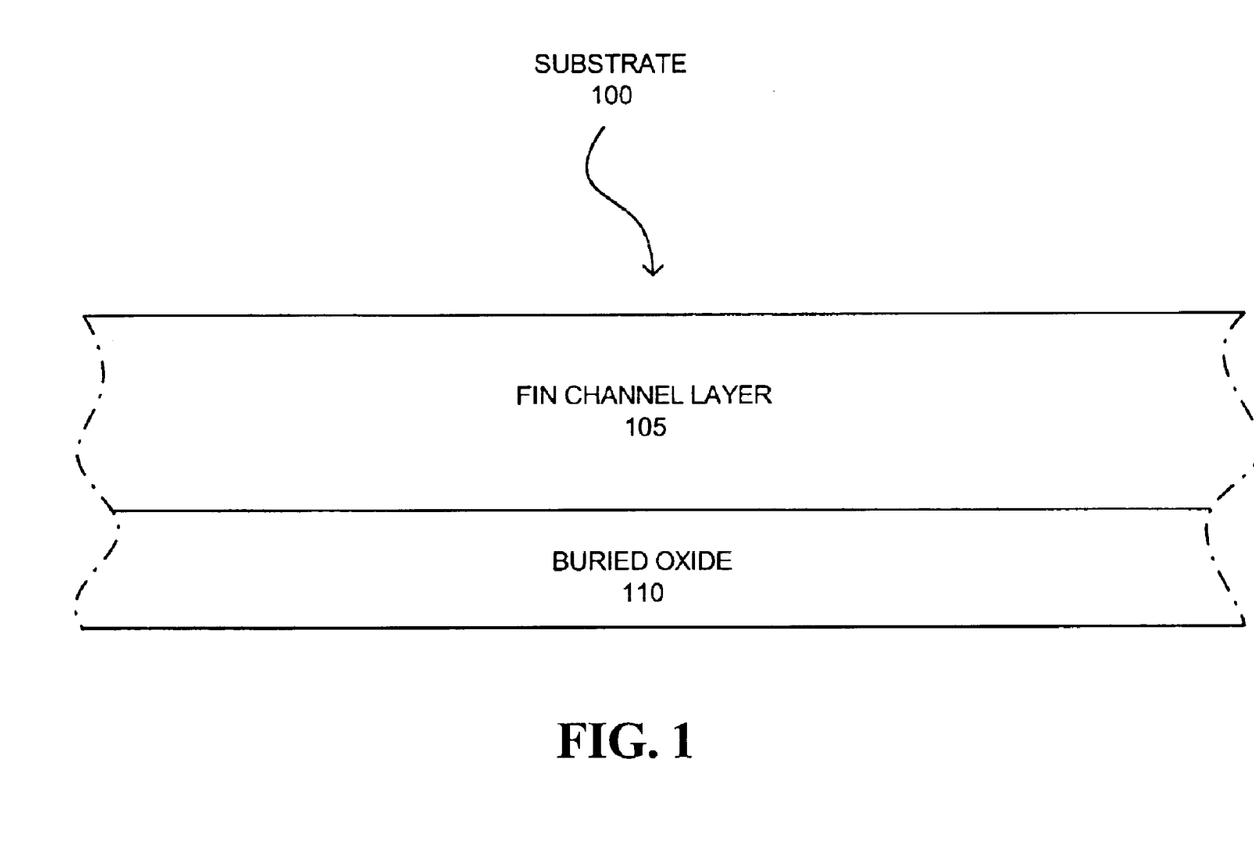
FIG. 1 illustrates exemplary layers of a substrate that may be used for forming a fin of a FinFET consistent with the present invention.

FIG. 1 illustrates a cross-section of a substrate 100 formed in accordance with an exemplary embodiment of the present invention. Substrate 100, consistent with the present invention, may be a silicon on insulator (SOI) structure that includes a fin channel layer 105 formed upon, for example, a buried oxide layer 110. Buried oxide layer 110 may be formed on a silicon layer (not shown). The thickness of fin channel layer 105 may range, for example, from about 500 Å to about 2000 Å and the thickness of buried oxide layer 110 may range, for example, from about 1000 Å to about 3000 Å.

Fin channel layer 105 may include a crystalline material with a lattice constant larger than the lattice constant of a crystalline material selected for a strained channel layer (described with respect to FIGS. 3A and 3B below). If, for example, silicon is selected for the strained channel layer, fin channel layer 105 may include a crystalline material with a lattice constant large than the lattice constant of silicon. Fin channel layer 105 may include, for example, $Si_xGe_{(1-x)}$ with x approximately equal to 0.7. Other values of x may be appropriately selected. One skilled in the art will recognize that crystalline materials other than $Si_xGe_{(1-x)}$ may be used such that the material's lattice constant is larger than the lattice constant of the crystalline material selected for the strained channel layer. In some embodiments, substrate 100 may be formed by wafer bonding epitaxial $Si_xGe_{(1-x)}$ to an oxide/Si substrate wafer. One skilled in the art will recognize, however, that other existing techniques may be used for forming substrate 100.

Figure 2A:
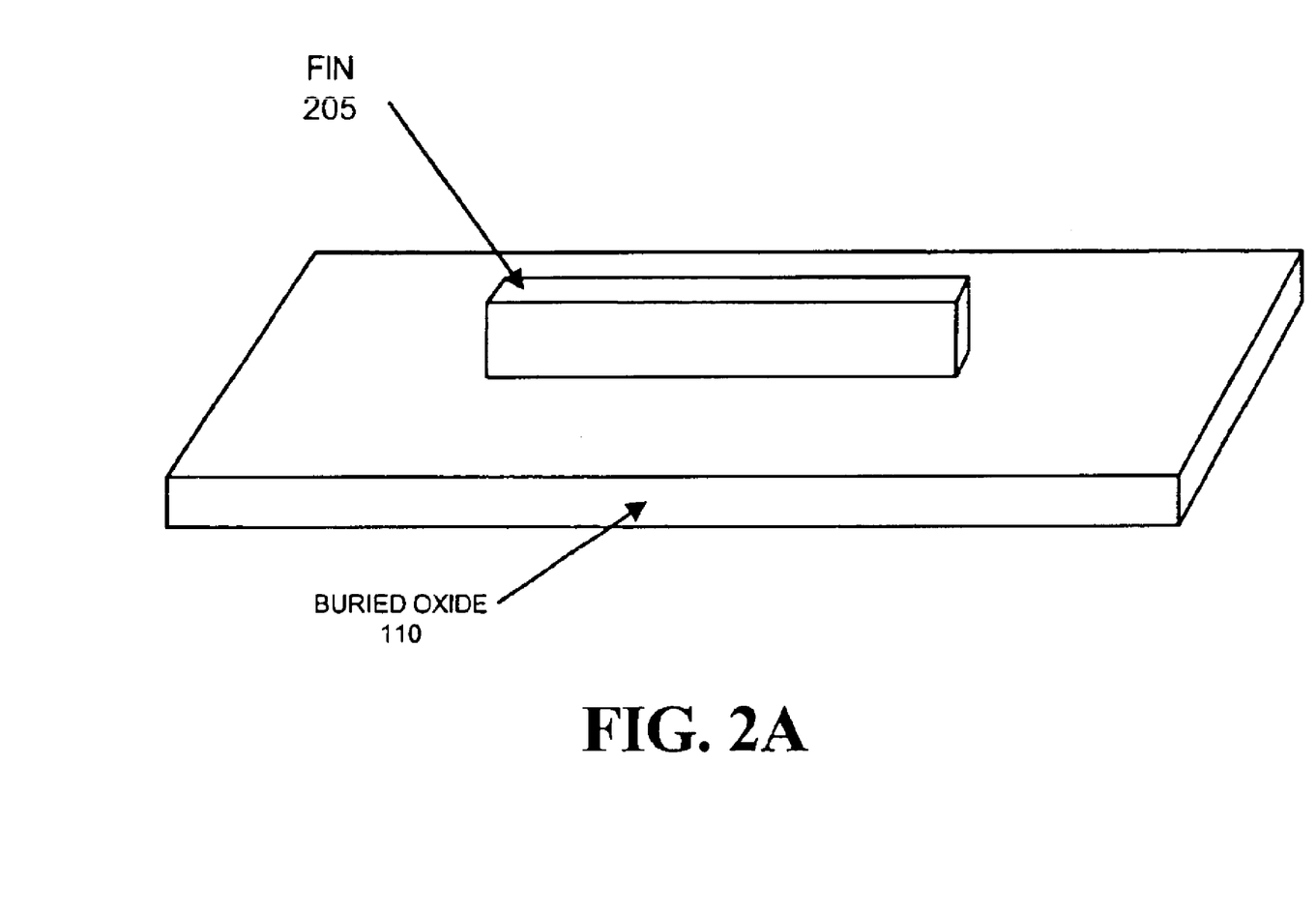
FIG. 2A illustrates an exemplary fin consistent with the invention.
Figure 2B:
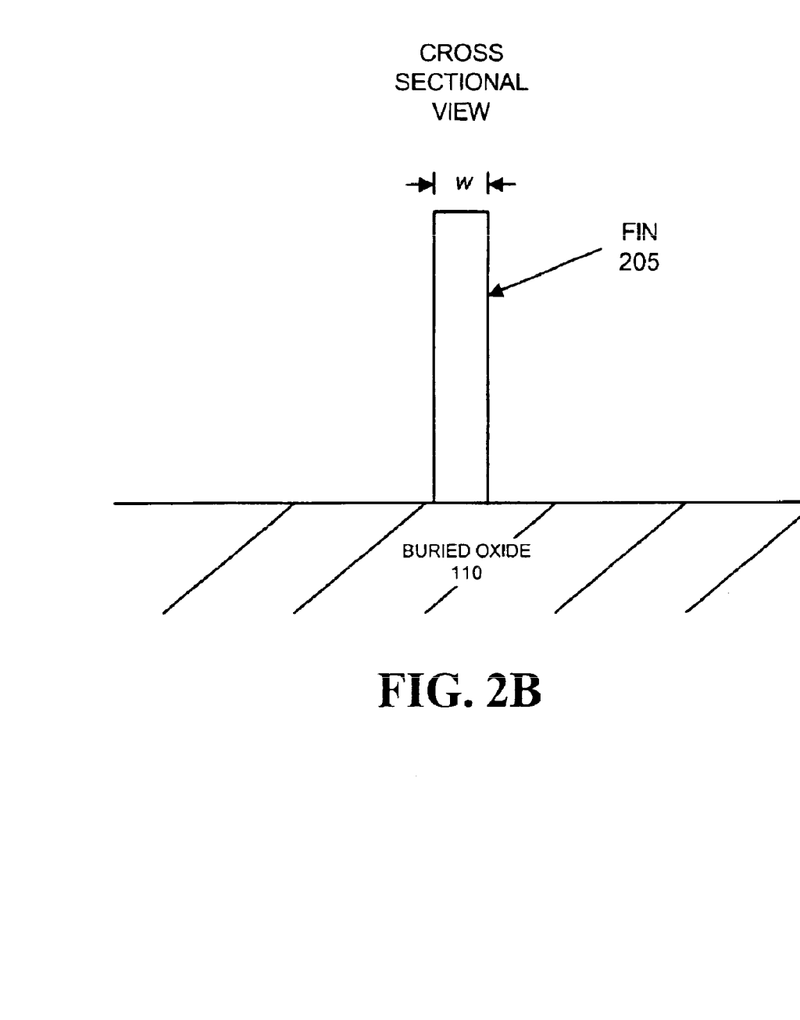
FIG. 2B illustrates a cross-sectional view of the exemplary fin of FIG. 2A consistent with the invention.

As shown in FIGS. 2A and 2B, after forming substrate 100, a vertical fin 205 may be formed from fin channel layer 105. Fin 205 may be formed, for example, with a width (w) in a range of 10–15 nm. Fin 205 may be formed from fin channel layer 105 using any existing process, including, but not limited to, existing photolithographic and etching processes.

Figure 2C:
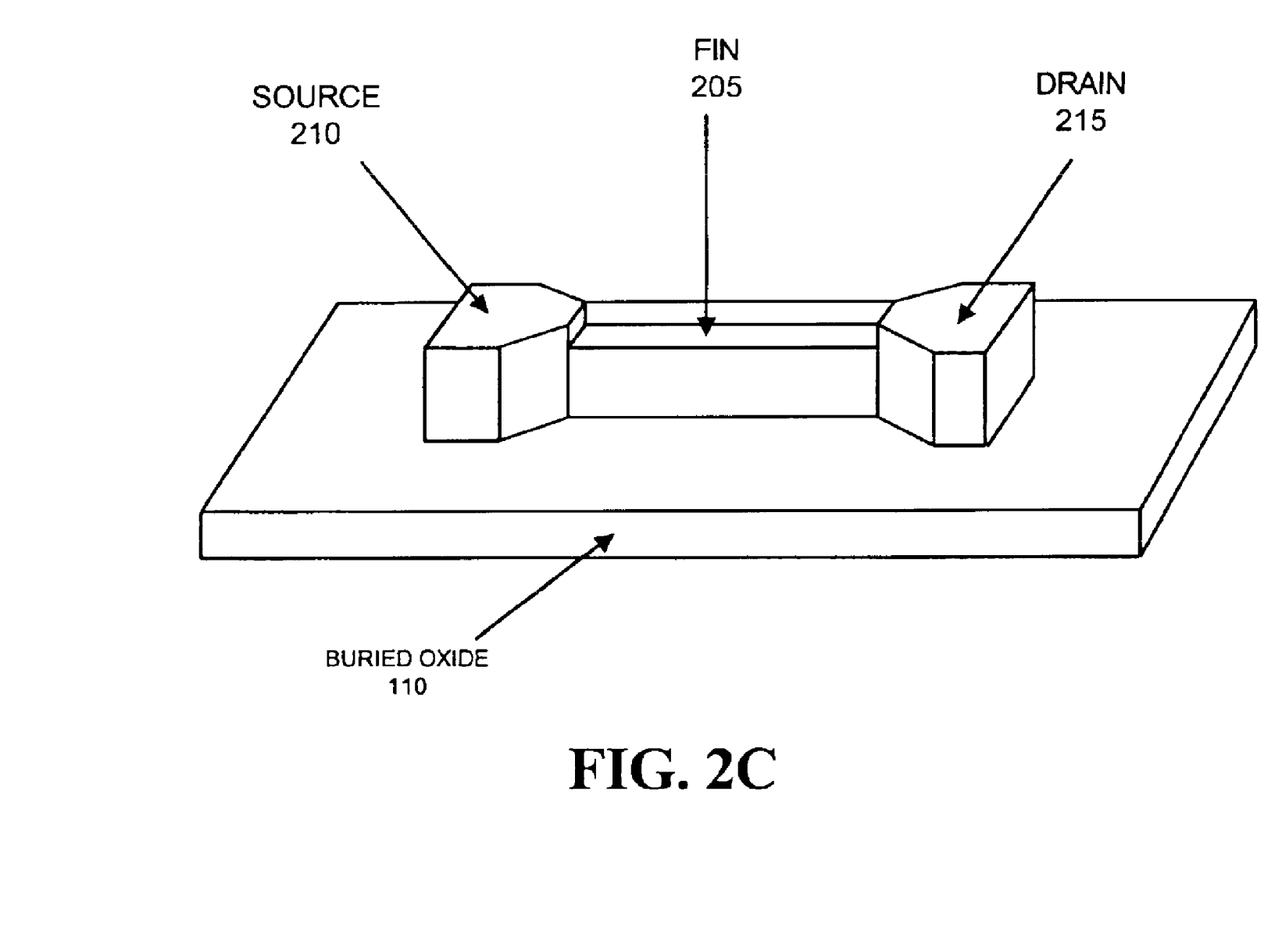
FIGS. 2C and 2D illustrate exemplary source and drain regions formed adjacent the fin of FIGS. 2A and 2B consistent with the invention.
Figure 2D:
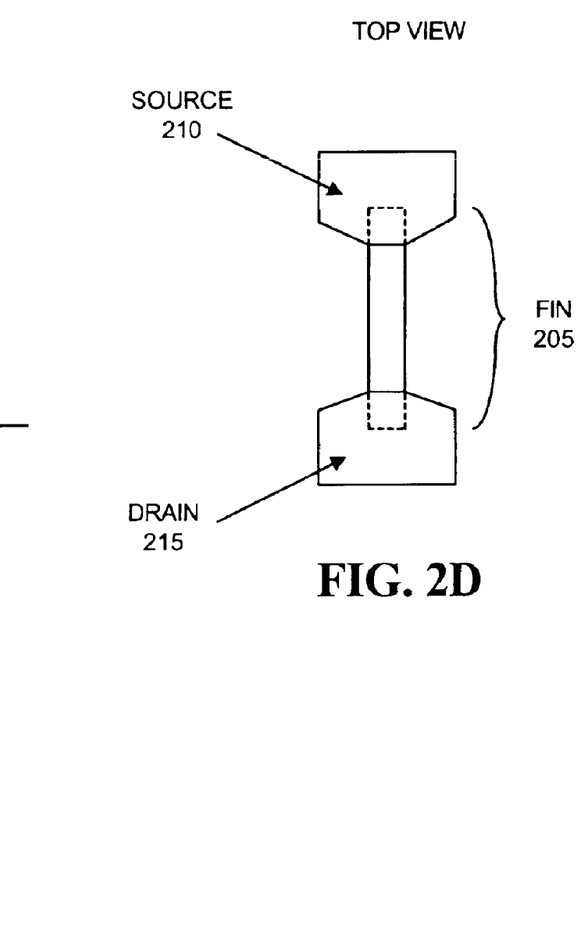

Subsequent to formation of fin 205, source 210 and drain 215 regions may be formed adjacent the respective ends of fin 205, as shown in FIGS. 2C and 2D. Source 210 and drain 215 regions may be formed by, for example, deposition of a layer of crystalline material over fin 205. The source 210 and drain 215 regions may be formed from the layer of crystalline material using, for example, existing photolithographic and etching processes. One skilled in the art will recognize, however, that other existing techniques may be used for forming source 210 and drain 215 regions. Source 210 and drain 215 regions may include a crystalline material such as, for example, $Si_xGe_{(1-x)}$, with x approximately equal to 0.7.

Figure 3A:
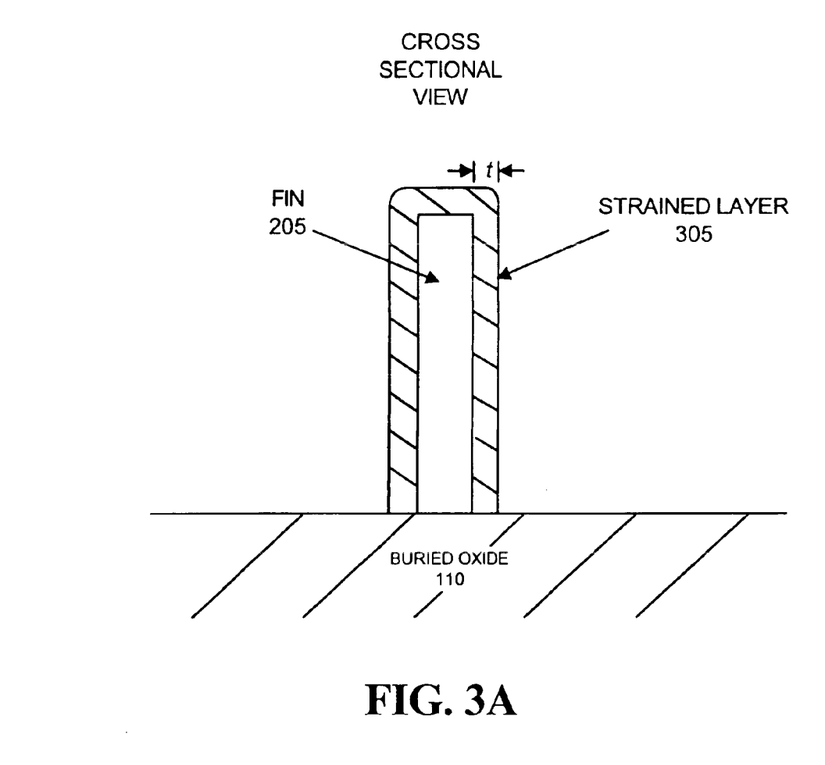
FIG. 3A illustrates a cross-sectional view of a strained layer formed on a fin consistent with the invention.
Figure 3B:
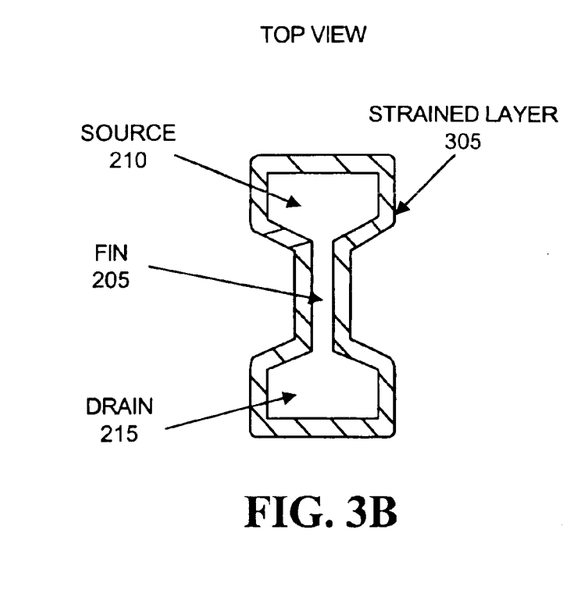
FIG. 3B illustrates a top view of the strained layer of FIG. 3A formed upon a fin and source and drain regions consistent with the invention.

After formation of source 210 and drain 215 regions, a strained layer 305 may be formed on fin 205, source 210 and drain 215, as shown in FIGS. 3A and 3B. Strained layer 305 may be formed on fin 205, source 210 and drain 215 using any appropriate existing process. In some exemplary embodiments, for example, strained layer 305 may be formed on fin 205, source 210 and drain 215 using a selective epitaxial deposition process. Strained layer 305 may include a crystalline material whose lattice constant is smaller that the lattice constant of the crystalline material used for fin 205. With a lattice mismatch between fin 205 and strained layer 305 tensile strain is produced in strained layer 305. Strained layer 305 may be formed, for example, with a thickness t that is approximately ½ to ⅓ of the fin 205 width w. For example, the thickness t of strained layer 305 may be 5 nm. Strained layer 305 may include, but is not limited to, silicon. One skilled in the art will recognize that other crystalline materials with lattice constants less than the crystalline material used to form fin 205 may, alternatively, be used.

Figure 4A:
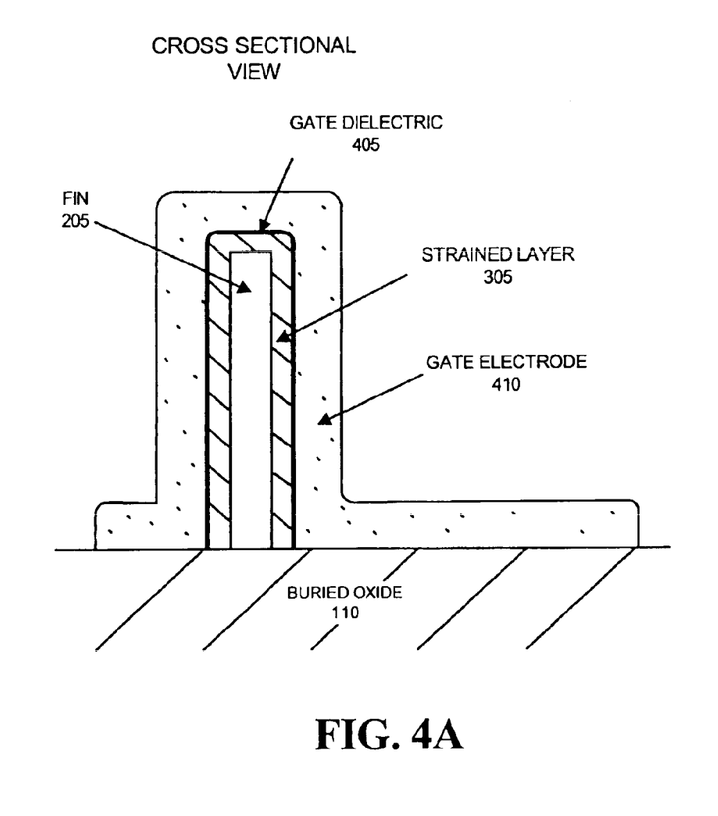
FIG. 4A illustrates a cross-sectional view of a gate dielectric and gate electrode formed upon a fin consistent with the invention.
Figure 4B:
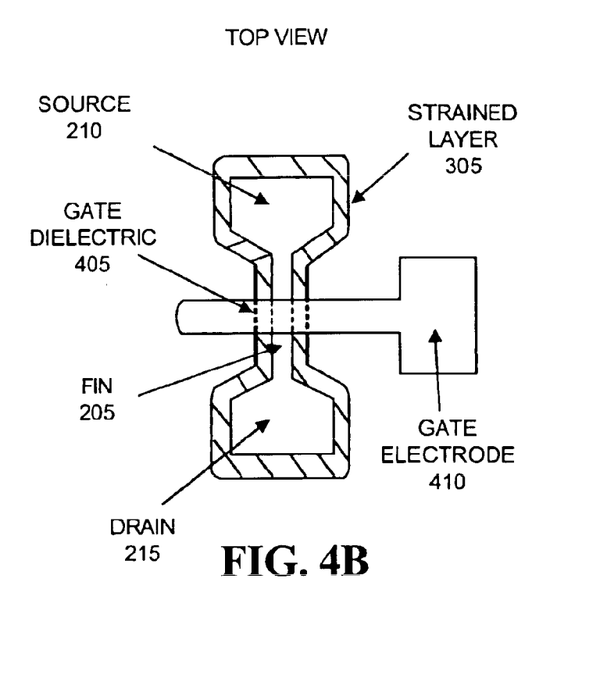
FIG. 4B illustrates a top view of the gate dielectric and gate electrode of FIG. 4A formed upon a fin consistent with the invention.

After formation of strained layer 305, a gate dielectric 405 and gate electrode 410 may be formed on the portion of fin 205 not covered by source 210 and drain 215, as shown in FIGS. 4A and 4B. The gate dielectric 405 may include a thin layer of dielectric material, such as SiO, $SiO_2$, SiN, SiON, $HFO_2$, $ZrO_2$, $Al_2O_3$, HFSiO(x) ZnS, $MgF_2$, or other dielectric materials. Gate electrode 410 may be formed upon gate dielectric 405 and may include, for example, a layer of polysilicon. Gate dielectric 405 and gate electrode 410 may be formed on fin 205 using any existing processes, such as, for example, existing deposition and patterning processes. Formation of gate dielectric 405 and gate electrode 410 upon fin 205, thus, produces a FET sidewall vertical channel that includes a thin strained layer 305 at both vertical surfaces of fin 205. Strained layer 305 provides improved carrier mobility through the induction of tensile strain in strained layer 305 caused by the lattice mismatch between strained layer 305 and fin 205. This carrier mobility enhancement can increase the drive current of a FinFET transistor created using the semiconductor structure shown in FIGS. 4A and 4B.

Exemplary Strained Insulator

Figure 5:
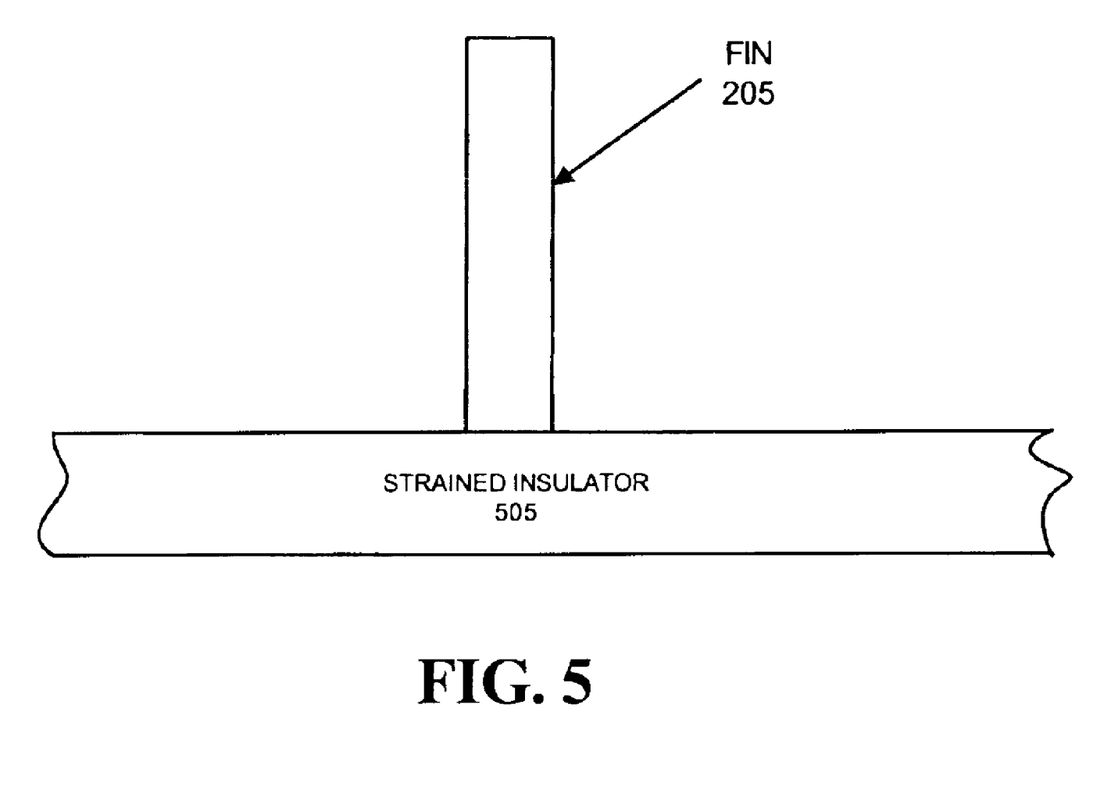
FIG. 5 illustrates a strained insulator underneath the fin of FIGS. 2A and 2B consistent with another embodiment of the present invention.

FIG. 5 illustrates an exemplary strained insulator 505 that may, consistent with another embodiment of the present invention, be formed beneath a fin of a FinFET, such as fin 205 shown in FIGS. 2A and 2B. Fin 205 may be formed upon the insulating material of strained insulator 505 such that the crystalline material of fin 205 and strained insulator 505 are lattice mismatched. A lattice mismatch between fin 205 and strained insulator 505 produces tensile strain in fin 205 that, in turn, improves carrier mobility of the FinFET. One skilled in the art will recognize that any appropriate insulating material, with a lattice constant that is mismatched with the crystalline material of fin 205, may be used as strained insulator 505.

Exemplary Source/Drain Regrowth Process

Figure 6:
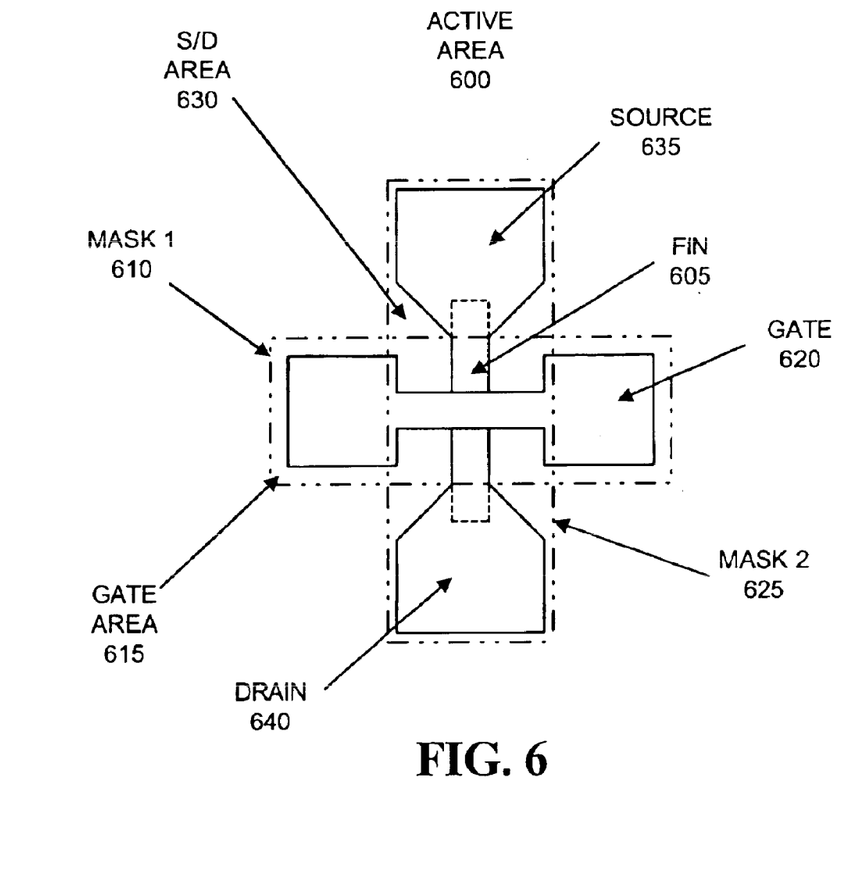
FIG. 6 illustrates damascene source/drain regrowth consistent with another embodiment of the present invention.

FIG. 6 illustrates exemplary damascene source/drain regrowth consistent with another embodiment of the present invention. After forming an active area 600 and fin 605 upon a substrate, tetraethylorthosilicate (TEOS) may be deposited upon fin 605 and active area 600 and then polished. A mask (mask 1) 610 may then be used to open a gate area 615. Fin 605 may be thinned down and a gate 620 may be formed by depositing and polishing polysilicon in gate area 615. A second mask (mask 2) 625 may be used to open a source and drain area 630. A nitride layer of active area 600, within the opened source and drain area 630, may be etched to expose a region of the source and drain area 630. From the exposed region, silicon can be selectively re-grown to produce a source 635 and a drain 640.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic and etching techniques may be employed, and hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A semiconductor device, comprising:
   a fin comprising a first semiconducting material; and
   a first layer formed on at least a portion of the fin, wherein the first semiconducting material induces tensile strain within the first layer and wherein a thickness of the first layer ranges from approximately 3.3 nm to 7.5 nm.

2. The device of claim 1, wherein a thickness of the fin ranges from about 500 Å to about 2000 Å.

3. The device of claim 1, wherein the fin has a width ranging from approximately 10 nm to 15 nm.

4. The semiconductor device of claim 1, wherein the first layer comorises a second semiconducting material and wherein the second semiconducting material comprises silicon.

5. The semiconductor device of claim 4, wherein the first semiconducting material comprises $Si_xGe_{(1-x)}$.

6. The semiconductor device of claim 5, wherein x equals approximately 0.7.

7. The semiconductor device of claim 1, further comprising:
   a second layer formed on at least a portion of the first layer, the second layer comprising a dielectric.

8. The semiconductor device of claim 7, further comprising:
   a gate electrode formed on at least a portion of the second layer, the gate electrode comprising polysilicon.

9. A transistor, comprising:
   a fin comprising a first semiconducting material that has a first lattice constant, the fin further comprising first and second end portions;
   source and drain regions formed adjacent the first and second end portions of the fin;
   a first layer of second semiconducting material formed on at least a portion of the fin, the second semiconducting material having a second lattice constant, wherein the first lattice constant is greater than the second lattice constant and wherein the first layer has a thickness ranging from about 3.3 nm to about 7.5 nm;
   a dielectric layer formed on at least a portion of the first layer; and
   a gate electrode formed on at least a portion of the dielectric layer.

10. The transistor of claim 9, wherein the fin has a width ranging from approximately 10 nm to 15 nm.

11. The transistor of claim 9, wherein the first layer has a thickness ranging from ½ to ⅓ of the fin width.

12. The transistor of claim 9, wherein a thickness of the fin ranges from about 500 Å to about 2000 Å.

13. The transistor of claim 9, wherein the gate electrode comprises a third semiconducting material.

14. The transistor of claim 13, wherein the third semiconducting material comprises polysilicon.

15. The transistor of claim 9, wherein the first semiconducting material comprises $Si_xGe_{(1-x)}$.

16. The transistor of claim 15, wherein the second serniconducting material comprises silicon.

17. The transistor of claim 16, wherein x equals approximately 0.7.

18. The transistor of claim 9, wherein the first layer comprises a strained layer and wherein tensile strain in the strained layer increases carrier mobility in the fin.

19. The device of claim 1, wherein the first layer comprises a second semiconducting material and wherein the first semiconducting material has a larger lattice constant than the second semiconducting material to induce the tensile strain within the first layer.

20. A semiconductor device, comprising:
   a fin comprising a first semiconducting material and a plurality of surfaces, wherein the fin comprises a width ranging from approximately 10 nm to 15 nm; and
   a first layer formed on at least a portion of the plurality of surfaces, the first layer comprising a second semiconducting material, wherein the first semiconducting material has a different lattice constant than the second semiconducting material to induce tensile strain within the first layer and wherein the first layer comorises a thickness that is approximately ½ to ⅓ of the fin width.

21. The semiconductor device of claim 20, wherein the first semiconducting material comprises a semiconducting material with a lattice constant larger than a lattice constant of the second semiconducting material.

22. A transistor, comprising:
   a fin comprising a first semiconducting material that has a first lattice constant, the fin further comprising first and second end portions and a width;
   source and drain regions formed adjacent the first and second end portions of the fin;
   a first layer of second semi-conducting material formed on at least a portion of the fin, the second semiconducting material having a second lattice constant, wherein the first lattice constant is greater than the second lattice constant and wherein the first layer comprises a thickness that is approximately ½ to ⅓ of the fin width;
   a dielectric layer formed on at least a portion of the first layer; and
   a gate electrode formed on at least a portion of the dielectric layer.

23. The transistor of claim 22, wherein the gate electrode comprises a third semiconducting material.

24. The transistor of claim 22, wherein the first lattice constant is greater than the second lattice constant to induce tensile strain in the first layer.

25. The transistor of claim 22, wherein the width ranges from approximately 10 nm to 15 nm.

26. A method of forming a semiconductor device, comprising:
   forming a fin comprising a first semiconducting material, a plurality of surfaces, and a width; and
   forming a first layer on at least a portion of the plurality of surfaces, the first layer comprising a second semiconducting material, wherein the first semiconducting material is lattice constant mismatched with the second semiconducting material to induce tensile strain within the first layer and wherein the first layer comprises a thickness that is approximately ½ to ⅓ of the fin width.

27. The method of claim 26, further comprising:
   selecting the first semiconducting material such that the first semiconducting material has a lattice constant greater than a lattice constant of the second seiniconducting material.

28. The method of claim 26, wherein the width of the fin ranges from approximately 10 nm to 15 nm.

* * * * *

UNITED STATES PATENT AND TRADEMARK OFFICE
CERTIFICATE OF CORRECTION

PATENT NO. : 6,897,527 B2
DATED : May 24, 2005
INVENTOR(S) : Dakshina-Murthy et al.

It is certified that error appears in the above-identified patent and that said Letters Patent is hereby corrected as shown below:

Column 5,
Line 21, the word "comorises" should be changed to -- comprises --.

Column 6,
Line 18, the word "comorises" should be changed to -- comprises --.
Lines 63 and 63, the word "seiniconducting" should be changed to -- semiconducting --.

Signed and Sealed this

Twentieth Day of September, 2005

JON W. DUDAS
*Director of the United States Patent and Trademark Office*